United States Patent [19]
Chappell et al.

[11] Patent Number: 5,541,427
[45] Date of Patent: Jul. 30, 1996

[54] SRAM CELL WITH CAPACITOR

[75] Inventors: Barbara A. Chappell, Amawalk; Bijan Davari, Mahopac; George A. Sai-Halasz, Mt. Kisco; Yuan Taur, Bedford, all of N.Y.

[73] Assignee: International Business Machines Corporation, Armonk, N.Y.

[21] Appl. No.: 162,588

[22] Filed: Dec. 3, 1993

[51] Int. Cl.⁶ .......................... H01L 27/108; H01L 27/11
[52] U.S. Cl. .......................... 257/306; 257/374; 257/397; 257/513; 257/752; 257/903
[58] Field of Search ................................ 257/513, 752, 257/903, 374, 397, 904, 306

[56] References Cited

U.S. PATENT DOCUMENTS

| | | | |
|---|---|---|---|
| 4,409,722 | 10/1982 | Dockerty et al. | 29/571 |
| 4,653,025 | 3/1987 | Minato et al. | 257/374 |
| 4,740,479 | 4/1988 | Neppl et al. | 437/34 |
| 4,785,341 | 11/1988 | Ning et al. | 257/554 |
| 4,805,147 | 2/1989 | Yamanaka et al. | 257/904 |
| 4,944,682 | 7/1990 | Cronin et al. | 437/192 |
| 4,966,870 | 10/1990 | Barber et al. | 437/228 |
| 5,045,916 | 9/1991 | Vor et al. | 257/383 |
| 5,072,286 | 12/1991 | Minami et al. | 257/903 |
| 5,145,799 | 9/1992 | Rodder | 437/47 |
| 5,173,450 | 12/1992 | Wei | 437/200 |
| 5,187,638 | 2/1993 | Sandhu et al. | 257/306 |
| 5,227,649 | 7/1993 | Chapman | 257/204 |
| 5,243,203 | 9/1993 | Hayden et al. | 257/66 |
| 5,246,876 | 9/1993 | Manning | 437/60 |
| 5,320,975 | 6/1994 | Cederbaum et al. | 257/903 |
| 5,334,862 | 8/1994 | Manning et al. | 257/903 |

FOREIGN PATENT DOCUMENTS

| | | |
|---|---|---|
| 0490877 | 7/1987 | European Pat. Off. . |
| 57-210664 | 12/1982 | Japan . |
| 61-239660 | 10/1986 | Japan . |
| 90271663 | 11/1990 | Japan . |
| 9353302 | 8/1993 | Japan . |

OTHER PUBLICATIONS

Debrosse et al. "Contact Process Providing Layout Advantages In A Static Random–Access Memory Cell:IBM TDB" vol. 32 No. 9A, Feb. 1990, pp. 434–436.

Dittrich, M. "Vertical Drive Device Polysilicon Load Static Random–Access Memory Cell:IBM TDB" vol. 31, No. 7, Dec. 1988, pp. 230–234.

Chesebro, D. et al., "Simplified Local Interconnection Technique For Sram and Logic Semiconductor Structures" IBM TDB vol. 34, No. 1, Jun. 1991 pp. 328–330.

F. White et al., "Damascene Stud Local Interconnect In CMOS Technology" IEDM 1992 pp. 301–304.

(List continued on next page.)

*Primary Examiner*—Robert P. Limanek
*Attorney, Agent, or Firm*—David Aker

[57] ABSTRACT

A storage latch comprising a gate insulating layer over the substrate, shallow trenches formed through the insulating layer and in the substrate to provide device insulation; and doped regions in the substrate between the shallow trenches. The doped regions define sources and drains. Gate stacks are formed over regions of oxide adjacent the doped regions. A planarized insulator is formed between the gate stacks. Openings are provided in the planarized insulator for contacts to the doped regions and the gate stacks. Conductive material fills the openings to form contacts for the doped regions and for the gate stacks. A patterned layer of conductive material on the planarized insulator connects selected ones of the contacts for wiring portions of the latch. A six device SRAM cell comprises a deep isolation trench formed in the substrate; a first latch including two transistors formed of p-type material on a first side of the trench; a second latch including two transistors formed of n-type material on a second side of the trench opposite the first side of the trench, and connection means for electrically cross wiring the transistors of the first latch to the transistors of the second latch. In forming the latch a self-aligned process for separately forming contacts to diffusion regions and gate stacks on the semiconductor substrate is used.

1 Claim, 8 Drawing Sheets

OTHER PUBLICATIONS

D. Kenney et al., "A Buried–Plate Trench Cell for n 64–Mb DRAM" 1992 Symposium on VLSI Technology Digest of Technical Papers, 1992 IEEE pp. 14–15.

R. D. J. Verhaar, et al. "A 25 µm² Bulk Full CMOS Sram Cell Technology With Fully Overlapping Contacts", IEDM 1990, IEEE pp. 473–476.

M. Helm et al., "A Low Cost, Microprocessor Compatible, 18.4 µm², 6–T Bulk Cell Technology for High Speed SRAMS" VLSI 93' 2 pages.

SRAM CELL WITH CAPACITOR

TECHNICAL FIELD

This invention relates to SRAM devices. More particularly it relates to a configuration for a small SRAM cell. Further, it relates to a process for producing SRAM semiconductor chips.

BACKGROUND ART

As information processing circuits progress towards higher levels of integration, there is growth in array size for cache and imbedded arrays, there is increased use of cache in high data volume machines, and with increased used of CMOS arrays in large, so called high end data processing machines, there are pressures to decrease the size of CMOS SRAM cells. Without such decrease in size it is necessary to make investments in larger chips, more aggressive lithography, and vertical enhancements. Such investments greatly increase the cost of the chips.

In addition to the requirement for reduced area, electrical requirements for SRAM cells are becoming more stringent. For example, increased reliability standards have resulted in larger device ratios being required in current products.

Soft error rate (SER) is also of great concern. Projections from prior work and preliminary sizing of cells used on 4 megabyte chips indicate that enhancement of stored charge will in all probability be required to avoid excessive SER. Without added capacitance the indigeneous static stored charge may be inadequate to prevent upset in the stored data due to "funneled" charge (field enhanced collection) that is collected too rapidly for the current from the p-devices to compensate.

Another problem associated with smaller cells, is the need for more complex and therefore thinner wiring of reduced pitch at the so called back end of the line (BEOL) levels needed to make interconnections to logic and SRAM peripheral circuitry. It is desirable to have a layout and process for dense SRAM cells which allows presently available BEOL wiring to be used, thus avoiding the cost and reliability problems associated with reduced pitch size wiring.

SUMMARY OF THE INVENTION

It is a principal object of the invention to provide a configuration for a small SRAM cell.

It is yet another object of the invention to provide a configuration for an SRAM cell, which while small in size, can be electrically connected to subsequent wiring layers which are of relatively large pitch.

It is another object of the invention to provide a method for producing a small SRAM cell suitable for high density applications.

In accordance with the invention a storage latch is formed on a semiconductor substrate. The storage latch comprises a gate insulating layer over the substrate, shallow trenches formed through the insulating layer and in the substrate to provide device insulation; and doped regions in the substrate between the shallow trenches. The doped regions define sources and drains. Gate stacks are formed over regions of the oxide adjacent the doped regions. A planarized insulator is formed between the gate stacks. Openings are provided in the planarized insulator for contacts to the doped regions and the gate stacks. Conductive material fills the openings to form contacts for the doped regions and for the gate stacks. A patterned layer of conductive material on the planarized insulator connects selected ones of the contacts for wiring portions of the latch.

The invention is also directed to a six device SRAM cell formed on a silicon substrate. The cell comprises a deep isolation trench formed in the substrate; a first latch including two transistors formed of p-type material on a first side of the trench; a second latch including two transistors formed of n-type material on a second side of the trench opposite the first side of the trench, connection means for electrically cross wiring the transistors of the first latch to the transistors of the second latch, the connection means including conductors arranged substantially perpendicular to the trench; and two access transistors accessing the latches, the accessing transistors being located on the second side of the trench.

The invention is further directed to a process for separately forming contacts to diffusion regions and gate stacks on a semiconductor substrate. The process comprises the steps of forming a conformal etch stop layer over the substrate and said gate stacks; forming a passivating layer over the etch stop layer of a thickness at least sufficient to cover the gate stacks; planarizing the passivating layer at a level corresponding to the etch step layer; forming first openings in the passivating layer and the gate stacks, the opening being positioned so as to be borderless to the diffusion regions and of a sufficient depth to make electrical contact to the gate stacks but not to the diffusion regions; forming several second openings in the passivating layer and the etch stop layer which are borderless to the gate stacks and of a sufficient depth to make electrical contact to the diffusion regions but, at the gate stacks, are of insufficient depth to make electrical contact to the gate stacks; and filling the first openings and the second openings with a conductive material, the conductive material forming the contacts.

DETAILED DESCRIPTION OF THE PREFERRED EMBODIMENTS

Figure 1:
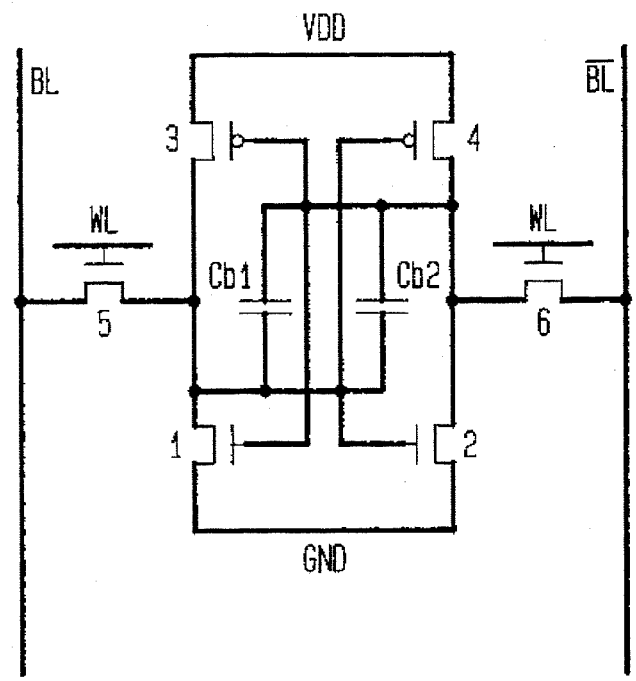
FIG. 1 is a schematic diagram of a SRAM cell in accordance with the invention.

FIG. 1 illustrates a six device SRAM cell in accordance with the invention. Two n-device field effect transistors 1 and 2 have their sources connected to a common ground plane. This is advantageous in that any mismatch in the contact resistance will not add to instability.

A latch formed of transistors 1 and 2 is cross-wired with a latch formed of p-device field effect transistors 3 and 4 which have their sources connected to a supply voltage VDD. An access transistor 5 connects transistors 1 and 3 to a bit line BL. A second access transistor 6 connects transistors 2 and 4 to bit line $\overline{BL}$. The gates of transistors 5 and 6 are connected to word line WL.

Built in capacitors Cb1 and Cb2 are cross-coupled between the latch drains. These capacitors oppose discharge current in parallel. Further, any increase in the low side voltage couples through these capacitors to add to the high side voltage. Thus, the effective stored charge on the cell may be increased as a result of the presence of these capacitors by as much as a factor of four. However, the capacitance is not large enough to substantially degrade the write time of the cell. In cells sized for a density used to form 4 megabyte storage chips, an increase in the stored charge of the cell from, for example, 10 fentocoulombs to 30 fentocoulombs may result in an order of magnitude decrease in soft error rate. This is because a cell with very small stored charge can be upset by "funneled" charge collection. This is field-enhanced conduction from along an alpha track that intersects the depletion region associated with a drain node. A current pulse of this nature may be faster than the time constant for delivering current through the p-device. If the stored charge of the cell is high enough to offset this initial rapid charge collection, the p-device current is high enough to compensate for any additional charge collected by a cell. This is especially true in the cell of the present invention, since the self-aligned contacts combined with shallow trench isolation allow a relatively small diffused area of the drain nodes to collect charge, as is more fully explained below.

The cell of FIG. 1 should be designed with adequate device sizes for reliable read and write stability and for reasonable performance. For example, the cell is designed to have a beta ratio of 1.7 of latch device WLR (width to length ratio) to access device WLR. Capacitors Cb1 and Cb2 also enhance stability for write margin. The ratio of the WLR of the access device to the WLR of the p-type transistors should be approximately 1.47. Further, for proper operation under burn in conditions the access device has a channel length 0.1 micrometer wider than minimum to assure that it is cut off when the word line is low. The access device has a WLR of 1.9. This ratio, combined with small bit-line contact area, results in a good read signal development rate. Alternatively, cell area may be increased by approximately 20% to achieve higher read speed by increasing wordline device size widths by a factor of two and other device widths so as to maintain the same read and write stability. The layout of the cell according to the present invention, as more fully described below, results in denser and faster peripheral circuitry, especially for that portion which is pitch-matched to the cell.

Figure 2:
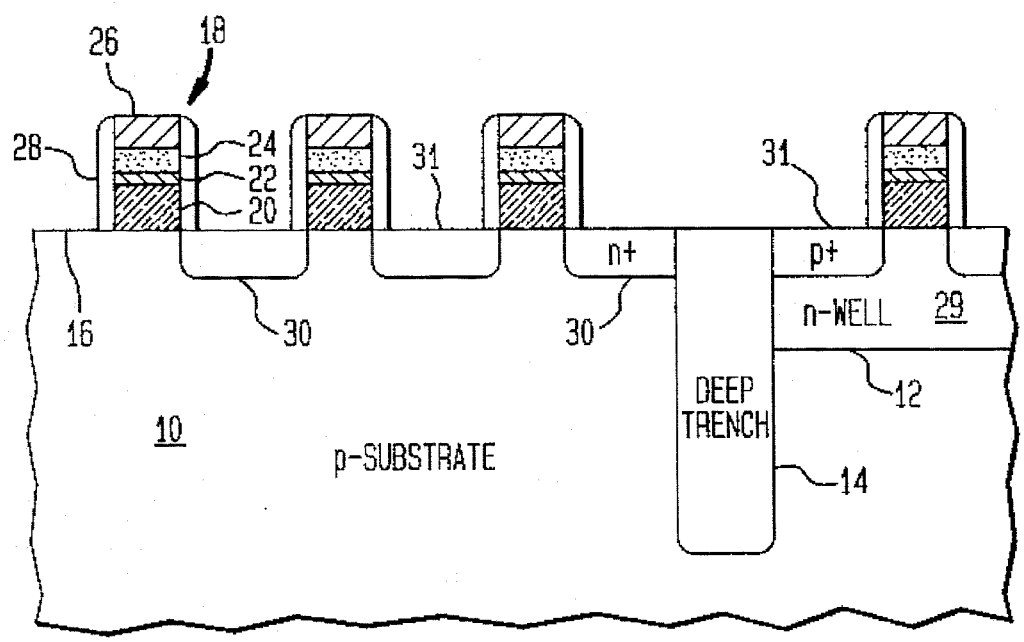
FIG. 2 to FIG. 8 are enlarged cross sectional representations of process steps used to form the cell of FIG. 1.

Referring to FIG. 2, the cell in accordance with FIG. 1 is fabricated on a P type substrate 10 which has, formed therein, an n-well 12 immediately adjacent to a deep isolation trench 14. Trench 14 and other isolation regions are formed by any one of a number of well known processes including lithography, etching, filling with an insulating material and planarization. For example, shallow trenches are also formed at positions as more fully explained below with respect to FIGS. 10 to 13.

A gate oxide layer 16 is then formed on the surface of substrate 10. A series of layers which eventually form gate stacks 18 are then deposited in succession over gate oxide layer 16. These include a polysilicon layer 20 approximately 150 nm thick formed of $n^+$ or $p^+$ material. A diffusion barrier layer 22 formed of, for example, titanium nitride and having a thickness of 100 nm is deposited over layer 20. This may be followed by a titanium silicide or tungsten layer 24 having a thickness of approximately 100 nm. The presence of this layer reduces the sheet resistance of the gate. Finally, a reactive sputtered nitride cap layer 26 also having a thickness of approximately 100 nm is deposited. This configuration is referred to below as a "polycide" gate, and the materials used to form it as "polycide".

After the layers described are deposited, photo lithography and etching processes are used to selectively remove portions of the layers to form the gate stacks 18. Nitride spacers 28 are formed along the gate edges.

Source and drain regions such as for example 29 and 30 are then formed by implantation and annealing in a manner well known in the art. Preferably a titanium silicide layer 31 is formed by a self-aligned technique on the source and drain regions, although this is not essential.

Figure 3:
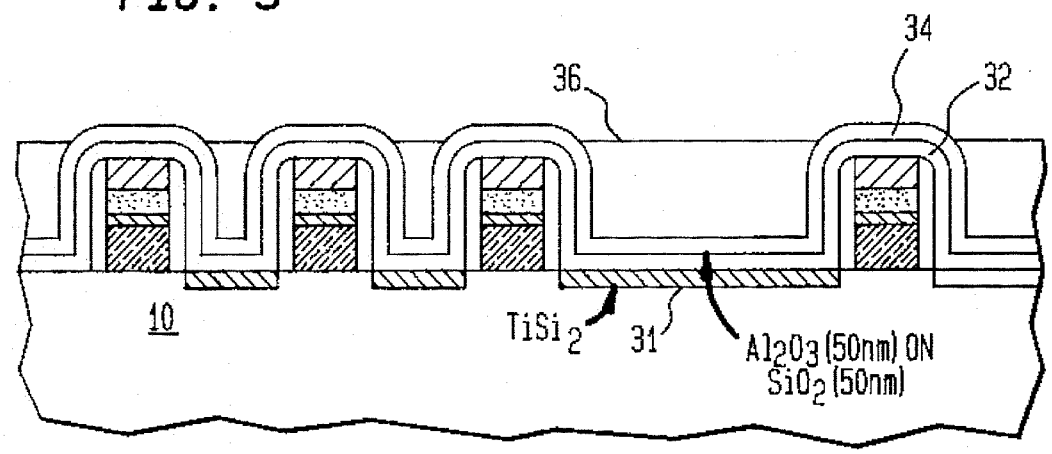

Referring to FIG. 3 a conformal coating of silicon dioxide approximately 50 nm thick is followed by an additional conformal coating of aluminum oxide also approximately 50 nm thick as represented by layer 32 (a bilayer). The use of these two layers allows the aluminum oxide to be stripped off with the silicon dioxide acting as a buffer so that the underlying diffusion regions are not damaged.

An additional conformal layer 34 formed by chemical vapor deposition of a nitride is then deposited over layer 32. Finally, a thick passivating layer 36 formed of an insulator such as an oxide (preferable silicon dioxide) is deposited to a thickness which covers gate stacks 18. Passivating layer 36 is then planarized to a level corresponding substantially to the top of gate stacks 18 by chemical-mechanical polishing and/or reactive ion etching (RIE).

Figure 4:
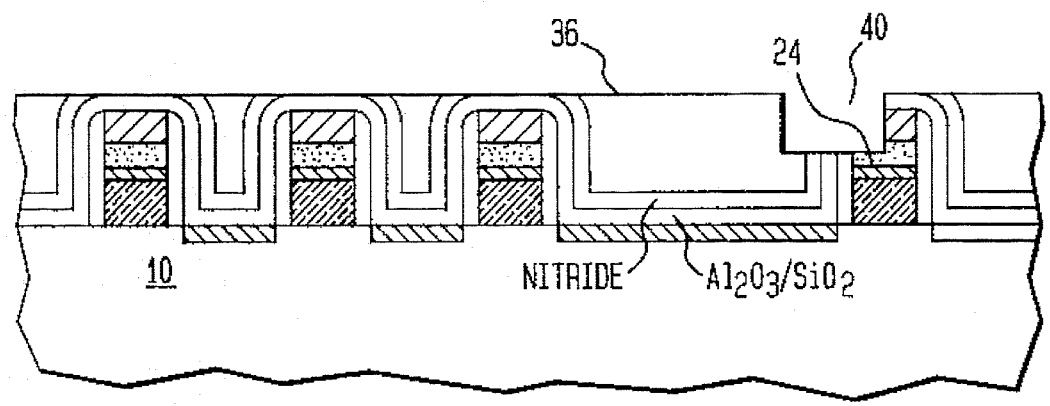

Referring to FIG. 4, an opening 40 also called a (CG) opening for electrical contact to a gate is formed with a mask process by a technique such as RIE. The etch is made through the nitride aluminum oxide and silicon dioxide layers and deep enough into the gate stack so that the tungsten silicide layer 24 is exposed and penetrated. Passivating layer 36 is etched to a similar depth. Thus, the opening for a contact which is borderless to both the gate and the passivating oxide is produced.

Figure 5:
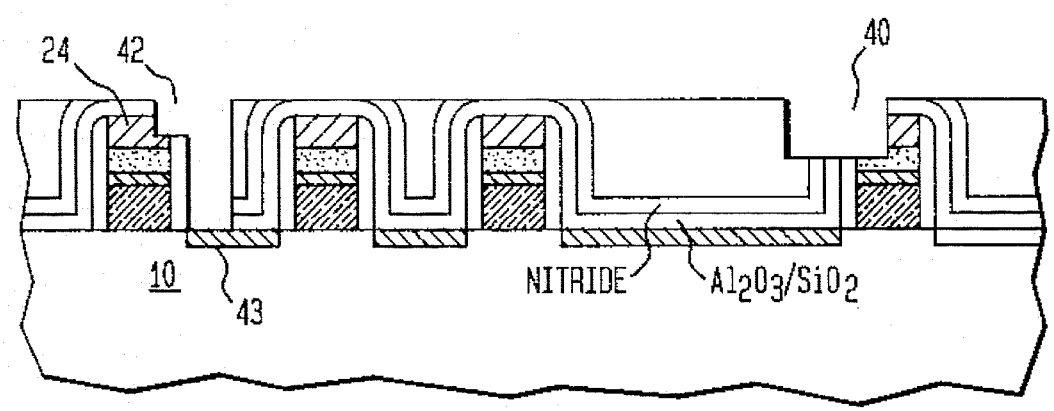

Referring to FIG. 5, a second set of openings 42 are provided for contacts to the diffusion region. These contacts are also designated (CD). This opening is placed so that it is borderless to the gate stack but makes contact with a diffusion region. Etching down to a diffusion region 43 through passivating layer 36 occurs. However, nitride cap 26 etches at a much slower rate so that tungsten silicide or tungsten layer 24 is not reached and thus, when opening 42 is filled with an electrically conductive material, there is no contact to the electrically conducive portions of gate stack 18.

More specifically, when the mask used to form openings 40 is used the nitride over the gate is first etched to expose the aluminum oxide film over the gate. The aluminum oxide film over the diffusion area is not exposed due to the thick oxide film over it. However, the aluminum oxide and sputtered nitride films are etched to contact the polycide gate (FIG. 4).

In FIG. 5 the passivating layer 36 and the nitride layer 34 are etched first, stopping on the aluminum oxide film both over the diffusion region and over the gate. The aluminum oxide film is then etched, followed by an oxide etch to contact the titanium silicide layer 31 (if it is used) over the diffusion region 43 or if layer 31 is not present, present, the diffusion region 43 directly. At this time the polycide gate is still insulated by the sputtered nitride cap 26 so shorting does not occur.

Figure 6:
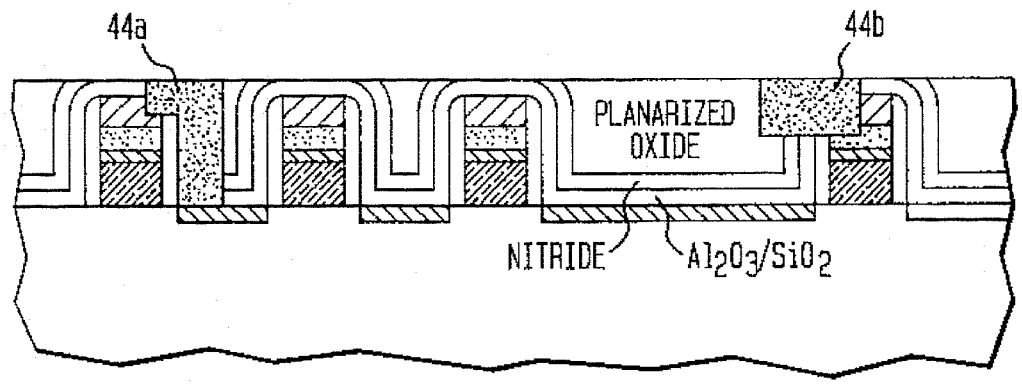

Once the contact holes are opened, as described above, a damacine process can be used to provide tungsten studs 44A and 44B in openings 42 and 40, respectively. After filling, these regions are planarized as shown in FIG. 6. No mask is needed.

Figure 7:
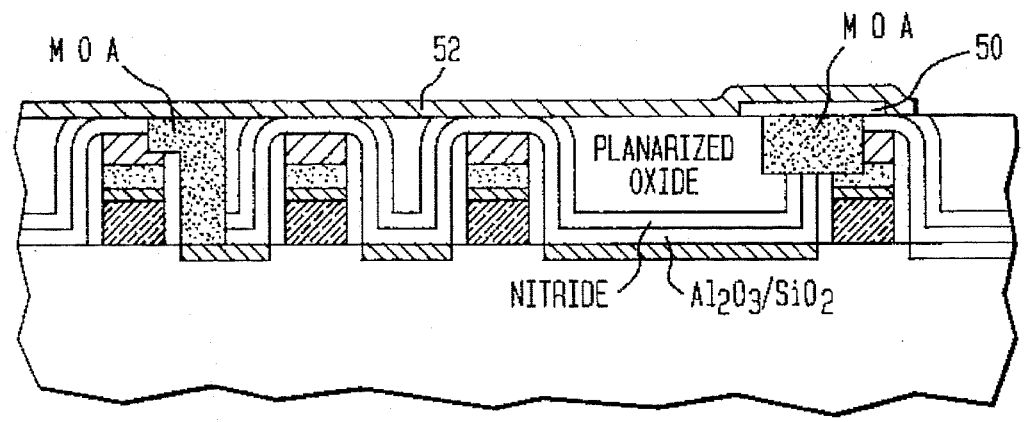
Figure 8:
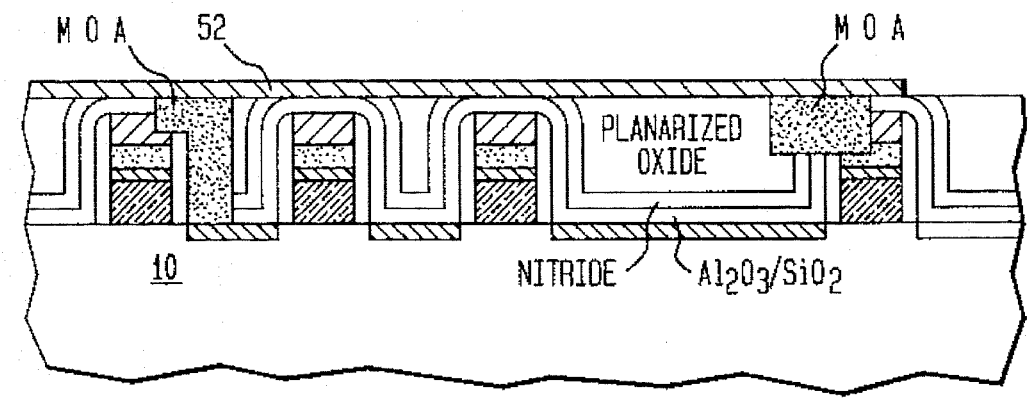

Referring to FIG. 7 a thin dielectric layer 50 is then formed on the planarized surface. Layer 50 is removed except for selected regions where it is used as the insulator of capacitors Cb1 and Cb2 (FIG. 1). A mask may be used to provide for this removal. Finally, as illustrated in FIG. 7 and FIG. 8 a thin film 52 of tungsten or aluminum is deposited and patterned to form electrical conductors. Where this film directly contacts a stud 44A or 44B an electrical connection is made. Where the film overlies dielectric layer 50 (FIG. 7) a capacitor is formed.

Figure 9:
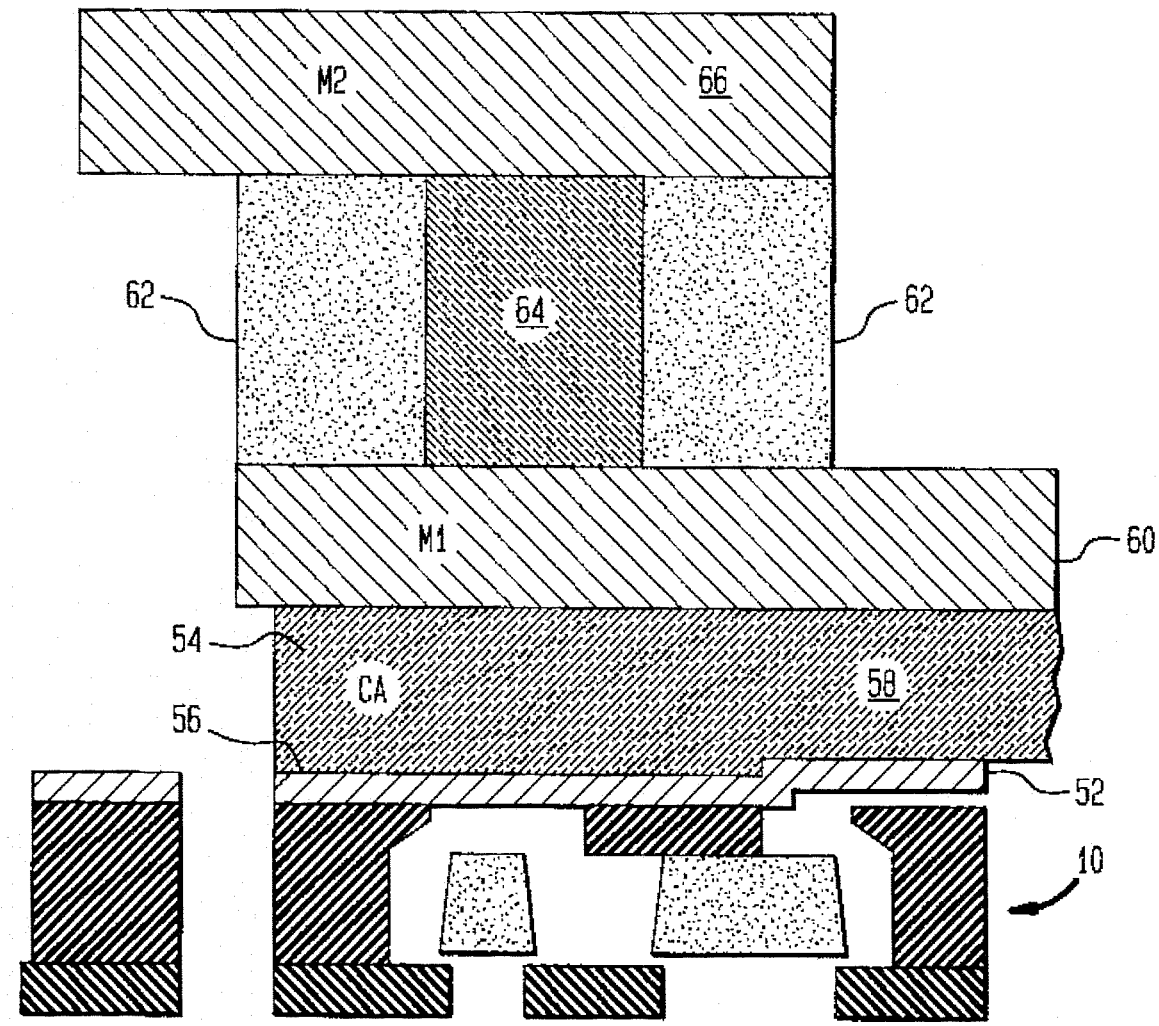
FIG. 9 is an enlarged somewhat schematic cross-sectional view of a substrate processed in accordance with the process steps of FIG. 2 to FIG. 8, showing connection to additional wiring levels.

Referring to FIG. 9 the substrate 10 upon which the process steps of FIG. 2 to FIG. 8 have been carried on is schematically illustrated. The patterned metalization layer 52 lends itself well to receiving contacts 54 in selected contact areas 56. The contacts 54 are essentially vias through a layer of insulating material 58. A further layer of metalization 60 is patterned on the surface of layer 58 and over contacts 54 so as to provide additional wiring. Further, as is well known in the art, additional contacts 62 may extend up through an additional insulating layer 64 to another patterned metal layer 66. However, the process according to the invention in combination with the cell layout, as described below, simplifies the amount of wiring that must be done in the layers above contacts 54.

Figure 10:
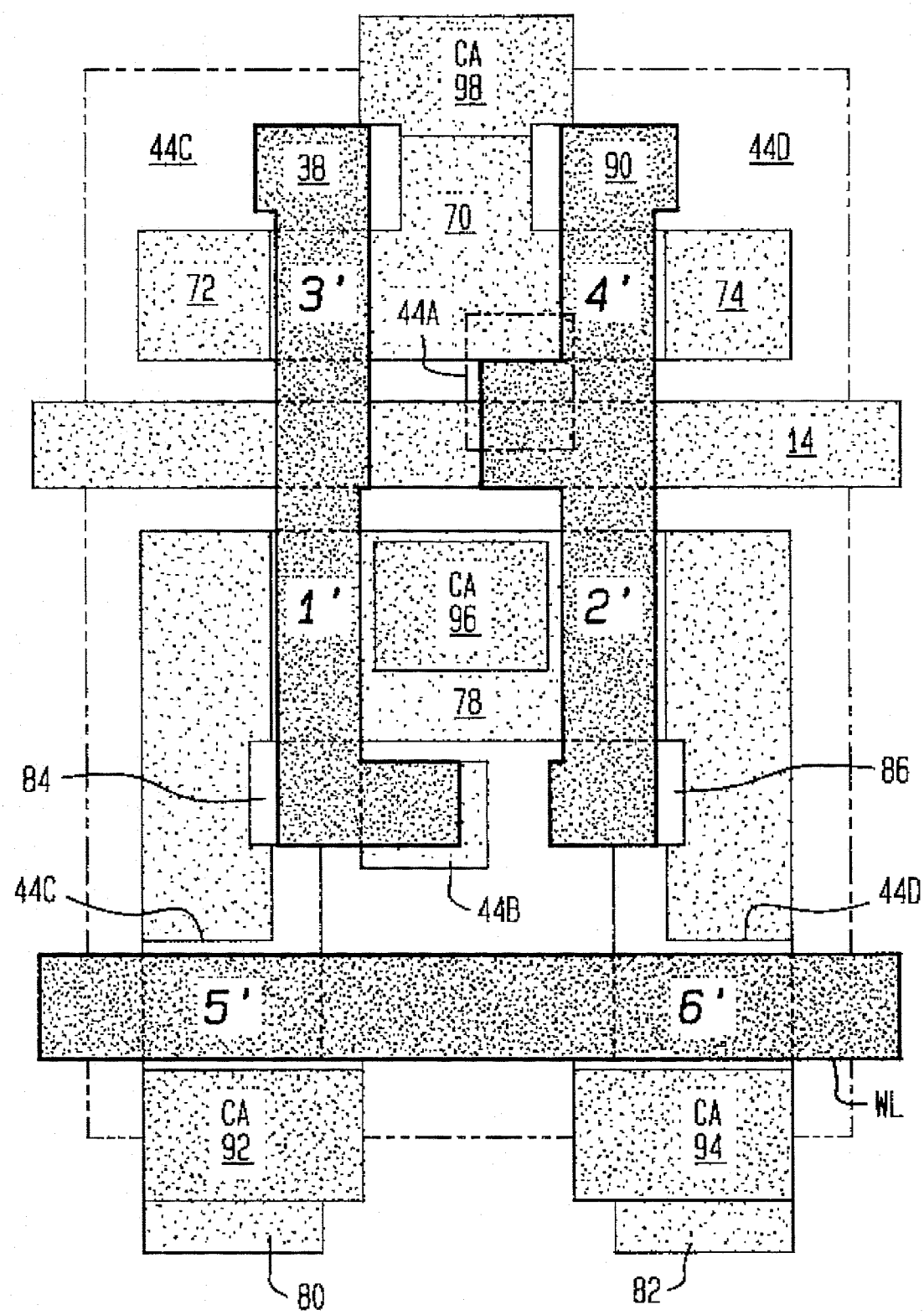
FIG. 10 is a plan view on a somewhat smaller scale than FIG. 2 to FIG. 8 of the cell of FIG. 1.

Referring to FIG. 10, the cell layout, at a level corresponding essentially to that which exists at the completion of the process steps described with respect to FIG. 6 is illustrated. The basic cell is small with dimensions of 3.6 um×5.0 um for a cell area of 18.0 um².

Transistors 3 and 4 are located on one side of deep trench 14 with their gate stack areas being represented by the reference numerals 3' and 4'. Transistors 1 and 2, with their gate stack areas represented by the references numerals 1' and 2' are located on the side of deep trench 14 opposite to the location of transistors 3 and 4. Separation of transistors 1 and 2 from transistors 3 and 4 by the relatively narrow deep trench, allows these transistors to be located quite close to one another and therefore decreases the area of the cell. Access transistors 5 and 6 are located on the same side of trench 14 as transistors 1 and 2 with the gate areas being represented by 5' and 6' respectively.

The various devices are isolated by shallow trench isolation areas. Active doped regions where the isolation trenches do not exist include the region generally shown as 70 in the shape of an upside down letter T formed by extensions 72 and 74, as well as a generally C shaped area 76 having a portion 78 which is horizontal in FIG. 10 as well as two portions 80 and 82 which are vertical in FIG. 10. Region 76 has two cut out regions 84 and 86 which are not doped.

The multilayer structure of the gates, including polysilicon and various other layers described above actually extend from the gates to form conductors 88 and 90. Wherever these conductors cross active doped silicon region a device channel is formed underneath the oxide coating as described above. The diffusion regions are then formed by a self aligned MOS process where regions on either side of the channel are the sources and drains. The sources of transistors 1, 2, 3 and 4 are each connected to one side of the power supply as more fully described below.

To complete the wiring shown in FIG. 10, contacts are provided as discussed above with respect to FIG. 6. Further when contacts 44A (FIG. 6) are provided, an associated metalization layer provides wires 44C and 44D to wire the drains of transistors 1 and 3 and transistors 2 and 4 to each other respectively. It will be understood that these two seperate metalization processes (CG) and (CD) may be carried out in any desired order.

Wordline WL is also formed of the same material as the gate stack and portions thereof define the gates of transistors 5 and 6. During the same mask step that is used to provide wires 44C and 44D, metalization regions 92, 94, 96 and 98 are also formed. These provide contact areas CA to the bit lines, ground, and VDD respectively. At this point all wiring is complete which is required for completion of the structures of FIG. 7 or FIG. 8, except for layer 52.

Figure 11:
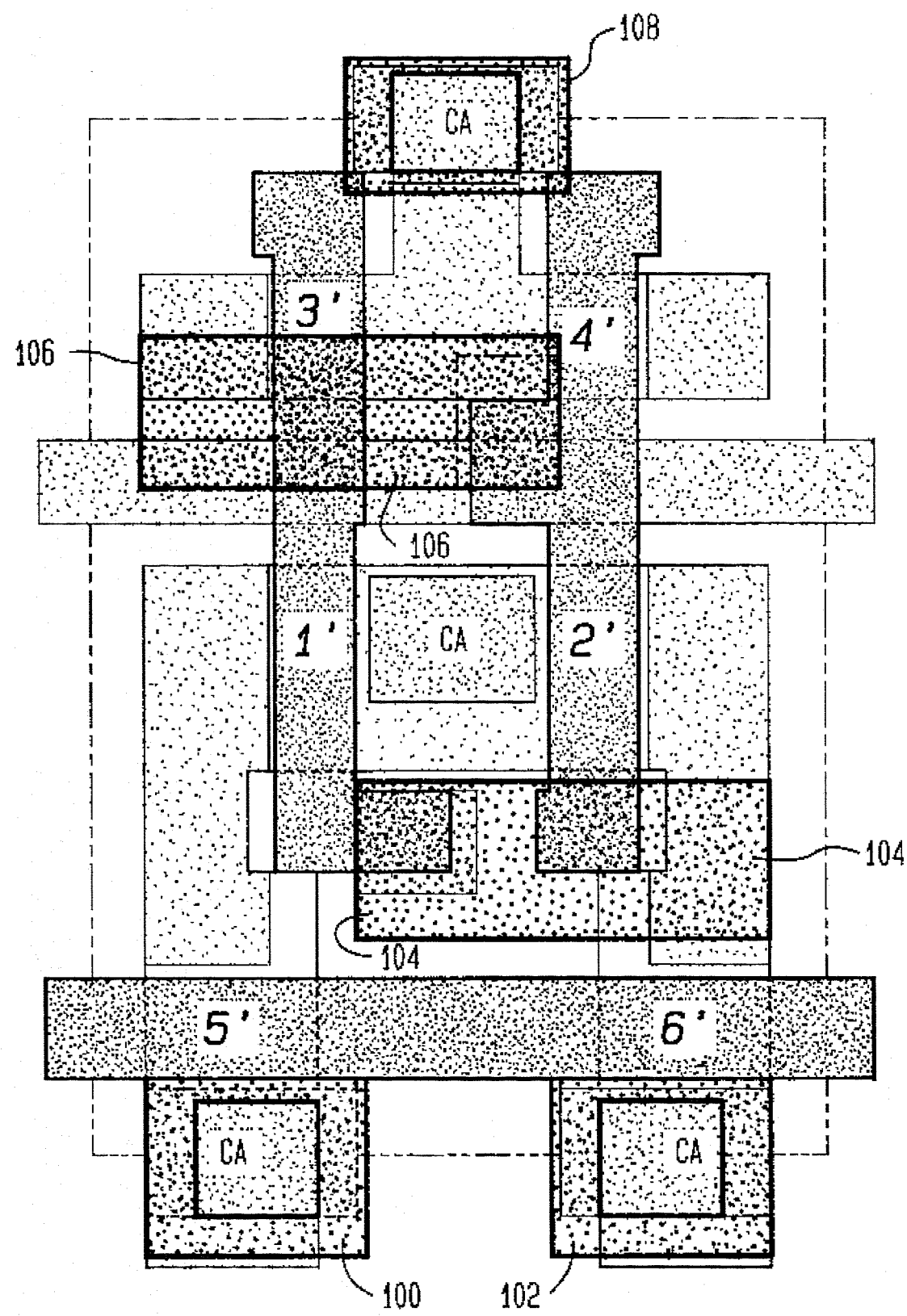
FIG. 11 is a plan view similar to FIG. 10 of the cell of FIG. 1 but without capacitors formed therein.

Referring to FIG. 11, a structure without capacitors Cb1 and Cb2 is produced. Layer 52 provides metalization regions 100, 102, 104 106 and 108. The latches are cross-connected by regions 104 and 106 and instead of capacitors being formed there are simply continuous electrical conductors.

If it is desirable to do so, at this point connections can also be made to VDD and ground. This may be done at this level without the use of an additional contact mask.

Figure 12:
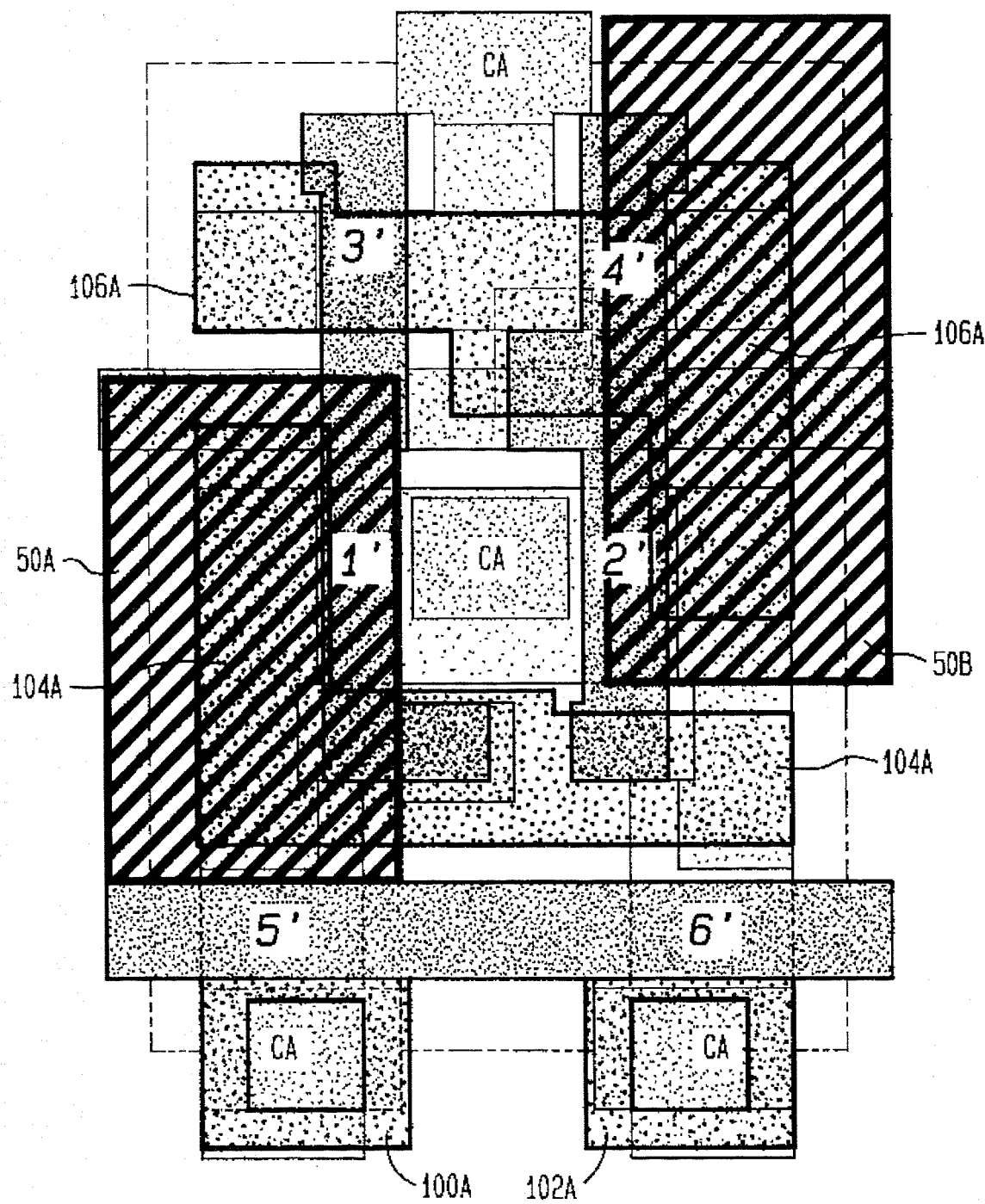
FIG. 12 is a plan view similar to FIG. 10 of the cell of FIG. 1 illustrating capacitors formed therein.

Referring to FIG. 12, prior to additional metalization regions such as those added in FIG. 11 being placed thereon, oxide dielectric regions 50A and 50B are formed (corresponding to insulator 50 of FIG. 7). Metalization layer 52 of FIG. 7 is then formed with regions 100A, 102A, 104A, and 106A. Regions 100A and 102A are very similar to regions 100 and 102 respectively of FIG. 11. However, regions 104A and 106A have extensions formed over appropriate portions of insulating layer regions 50A and 50B so as to define capacitors Cb1 and Cb2. Thus the device of FIG. 1 is produced.

Figure 13:
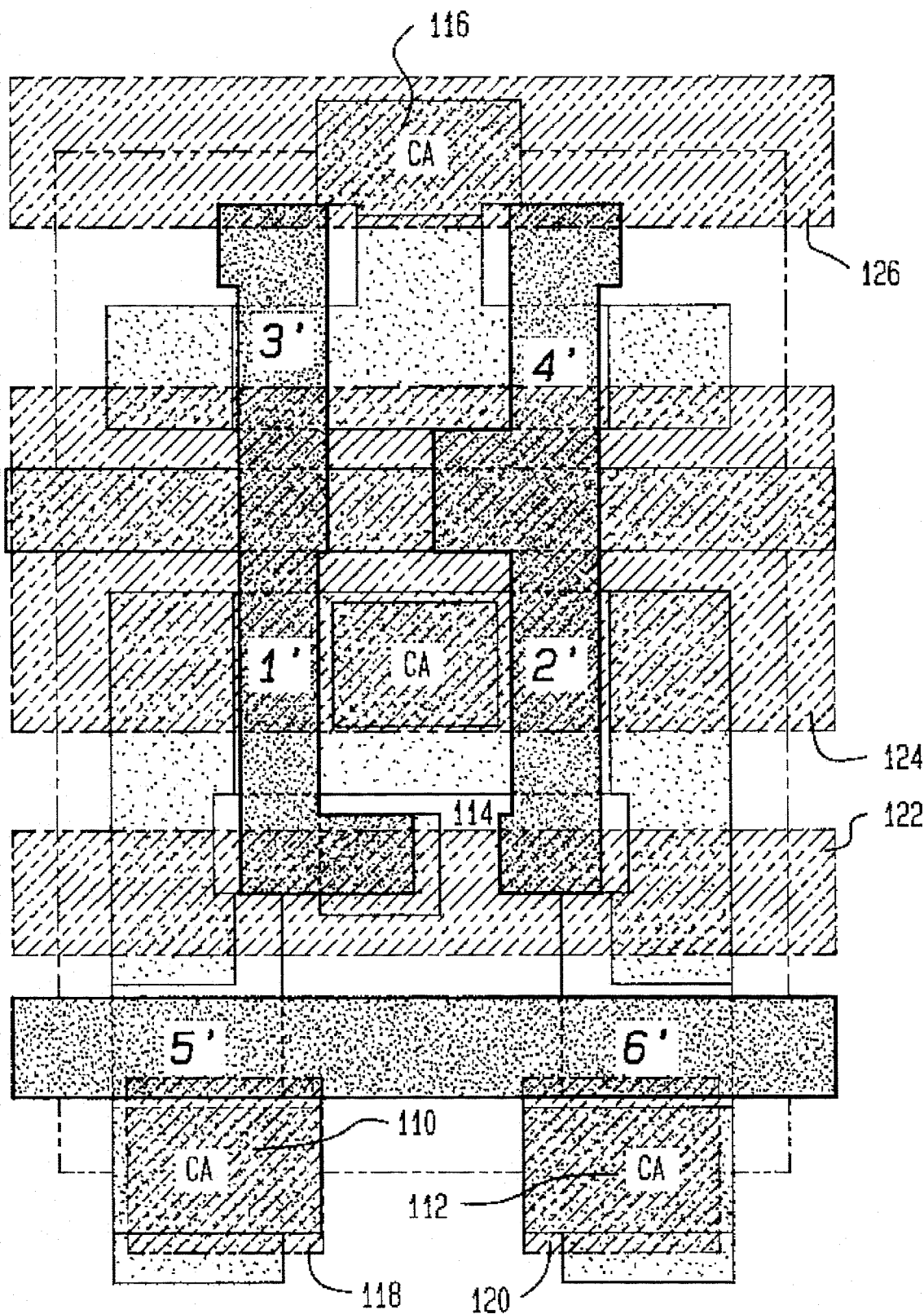
FIG. 13 is a plan view similar to FIG. 10 of the cell of FIG. 1 with a subsequent wiring level added.

Referring to FIG. 13, in subsequent processing steps the contact areas are filled with conductive material to form vias 110, 112, 114 and 116, each of a conductive material corresponding to contact 54 of FIG. 9. Finally, an additional metalization layer 60 is deposited and patterned to form bit line contacts 118 and 120, wordline strap 122, ground conductor 124, and VDD conductor 126. These conductive regions are in turn connected to subsequent levels of wiring as illustrated in FIG. 9.

While the invention has been particularly shown and described with respect to preferred embodiments thereof, it will be understood by those skilled in the art that changes in form and details may be made therein without departing from the scope and spirit of the invention.

We claim:

1. A storage latch formed on a semiconductor substrate, comprising:

a gate insulating layer over said substrate;

shallow trenches formed through said insulating layer and in said substrate to provide device insulation;

doped regions in said substrate between said shallow trenches, said doped regions defining sources and drains;

gate stacks over regions of said oxide adjacent said doped regions;

a planarized insulator formed between said gate stacks;

openings in said planarized insulator for contacts to said doped regions and said gate stacks;

conductive material filling said openings to form contacts for said doped regions and for said gate stacks;

dielectric material disposed over selected ones of said contacts, and a patterned layer of conductive material on said planarized insulator for connecting selected ones of said contacts for wiring of said latch, said patterned layer of conductive material extending over said dielectric material so as to form a capacitor of said latch over said selected contacts.

* * * * *